United States Patent [19]

Hoffman

[11] Patent Number: 4,609,980

[45] Date of Patent: Sep. 2, 1986

[54] SWITCHING POWER SUPPLY WITH TRANSISTOR DRIVE CIRCUIT

[75] Inventor: Gilbert A. Hoffman, Aloha, Oreg.

[73] Assignee: Tektronix, Inc., Beaverton, Oreg.

[21] Appl. No.: 708,603

[22] Filed: Mar. 5, 1985

[51] Int. Cl.⁴ .......................................... H02M 3/335
[52] U.S. Cl. ..................... 363/20; 307/254;
 307/270; 323/289; 363/131
[58] Field of Search ................. 363/131, 20; 323/289;
 307/270, 300, 254

[56] References Cited

U.S. PATENT DOCUMENTS

| 4,447,741 | 5/1984 | Moschopoulos | 323/289 |
| 4,562,361 | 12/1985 | Hattori et al. | 307/254 |

FOREIGN PATENT DOCUMENTS

| 10523 | 4/1970 | Japan | 323/289 |
| 57-028 | 4/1982 | Japan | 307/270 |
| 175977 | 10/1983 | Japan | 363/131 |

OTHER PUBLICATIONS

Palmucci, "Switching Regulator with Transistor Turn-off", IBM Tech. Discl. Bul., vol. 16, No. 4, p. 1161, Sep. 1973.

Primary Examiner—William H. Beha, Jr.
Attorney, Agent, or Firm—John Smith-Hill; Francis I. Gray

[57] ABSTRACT

A switching power supply that comprises a base drive transformer, a switch device connected to one end of the transformer's primary winding, and a transistor having its base connected to one end of the secondary winding and its emitter connected to the other end of the secondary winding, also comprises a current-dependent voltage clamp connected across one winding of the transformer. The clamp circuit prevents the voltage across the primary winding from exceeding a predetermined value so long as the magnetizing current that flows in the primary winding when the switch device is opened does not exceed a predetermined value.

4 Claims, 2 Drawing Figures

SWITCHING POWER SUPPLY WITH TRANSISTOR DRIVE CIRCUIT

This invention relates to a switching power supply.

BACKGROUND OF THE INVENTION

A switching power supply of a kind that has previously been proposed is shown in FIG. 1 and comprises a transformer 2 having its primary winding 4 connected in series with the collector-emitter path of a transistor 6 between the two terminals of a DC voltage source, and a secondary winding 8 connected through a rectifier 10 and a low pass filter 12 to a load 14. The load might be, for example, the power supply bus of a laboratory instrument. It will be understood that by those skilled in the art that when the transistor 6 is switched on, current builds up in the primary winding 4. When the transistor 6 is turned off, the current switches to the secondary winding 8, where it decays. The current flowing in the secondary winding 8 of the transformer 2 is rectified and filtered and is applied to the load 14.

The transistor 6 is turned on and off by a base drive circuit comprising a transformer 16, a transistor 18, a zener diode 20 and a pulse generator 22. Typically, the primary winding 24 of the transformer 16 is connected to a +12 volts DC source. The pulse generator 22 generates pulses in a pulse train having a repetition frequency that would typically be about 30 kHz. The duty cycle of the pulse train varies in dependence upon the power demands of the load connected to the transformer 2. Typically, the duty cycle might vary between 10% and 50%. When the transistor 18 is switched on by a pulse from the generator 22, current flows in the primary winding 24 of the transformer 16 and a corresponding current is induced in the secondary winding 26, providing forward base current to the transistor 6 and thus turning the transistor 6 on, and resulting in build-up of charge in the base-emitter region of the transistor 6. The forward base current is limited by the resistor 28. During the time that the transistor 18 is on, magnetizing current is building in the primary winding 24 of the transformer 16.

When forward base current flows in the secondary winding 26, the capacitor 30 is charged in the manner indicated, so that when current ceases to flow in the primary winding 24 the base of the transistor 6 is held negative, thus keeping the transistor 6 off. The diode 32 limits the potential drop across the capacitor 30 to one diode drop (about 0.6 volts).

When the transistor 18 is turned off, the voltage at the collector of the transistor 18 rises somewhat, e.g. to 13 volts, and the magnetizing current which was flowing in the primary winding 24 of the transformer 16 is transferred to the secondary winding 26 as reverse base current, drawing charge carriers from the base-emitter region of the transistor 6. The reverse base current is proportional to the primary winding's magnetizing current. When the transistor 6 can no longer sustain reverse base current (its base-emitter region is depleted of charge carriers and it therefore turns off), current ceases to flow in the secondary winding 26. At that point, the magnetizing current is transferred back to the primary winding 24 and the voltage at the collector of the transistor 18 rises to the threshold value of the zener diode 20, e.g. 30 volts. The large potential difference across the primary winding 24 allows rapid demagnetization of the transformer core.

The sequence of events happens once per cycle at the operating frequency of the generator 22.

As noted above, the reverse base current is proportional to the magnetizing current that flows in the primary winding 24. The magnetizing current is proportional to the length of time that the transistor 18 is on (duty cycle).

The reverse base current is dependent on duty cycle, and since duty cycle changes with input voltage and output load conditions, the reverse base current can change substantially. This implies that the transistor 6 may dissipate more power than necessary under certain line and load conditions.

SUMMARY OF THE INVENTION

According to the present invention there is provided a switching power supply comprising a base drive transformer having a primary winding, a secondary winding and a core of magnetic material, a switch device connected to one end of the primary winding, and a transistor having its base connected to one end of the secondary winding and its emitter connected to the other end of the secondary winding, so that when the primary winding and the switch device are connected between a source of DC voltage and the switch device is closed intermittently, collector current is developed in the transistor, and the power supply also comprising a current-dependent voltage clamp connected across a winding of the transformer for preventing the voltage across the transformer winding from exceeding a predetermined limit so long as the magnetizing current that flows in the primary winding when the switch device is opened does not exceed a predetermined value.

In a preferred embodiment of the invention, the effect of the current-dependent voltage clamp is to reduce the variation with duty cycle of the reverse base current, and this reduces the power dissipated in the transistor.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
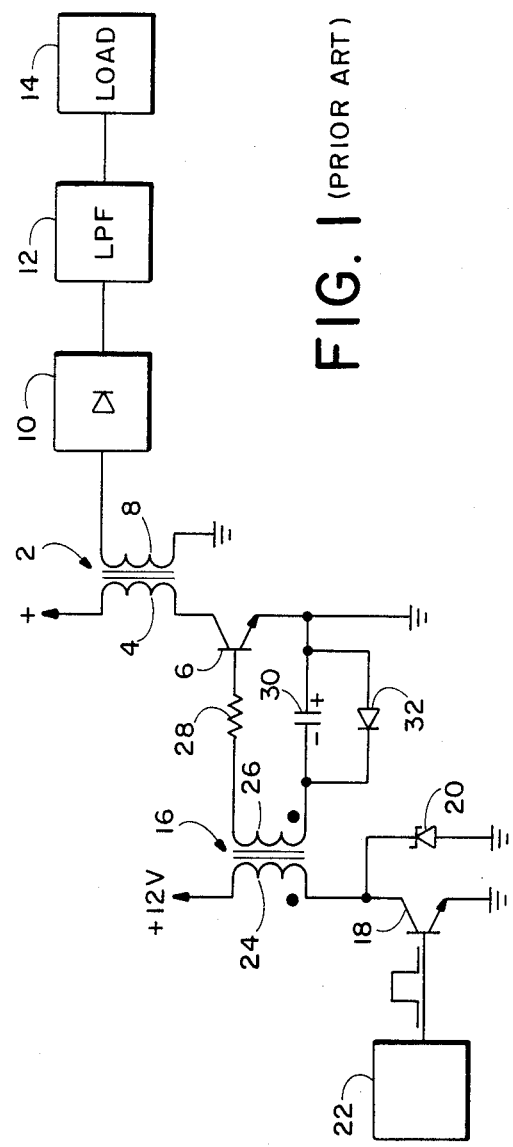
FIG. 1 illustrates schematically a conventional switching power supply.
Figure 2:
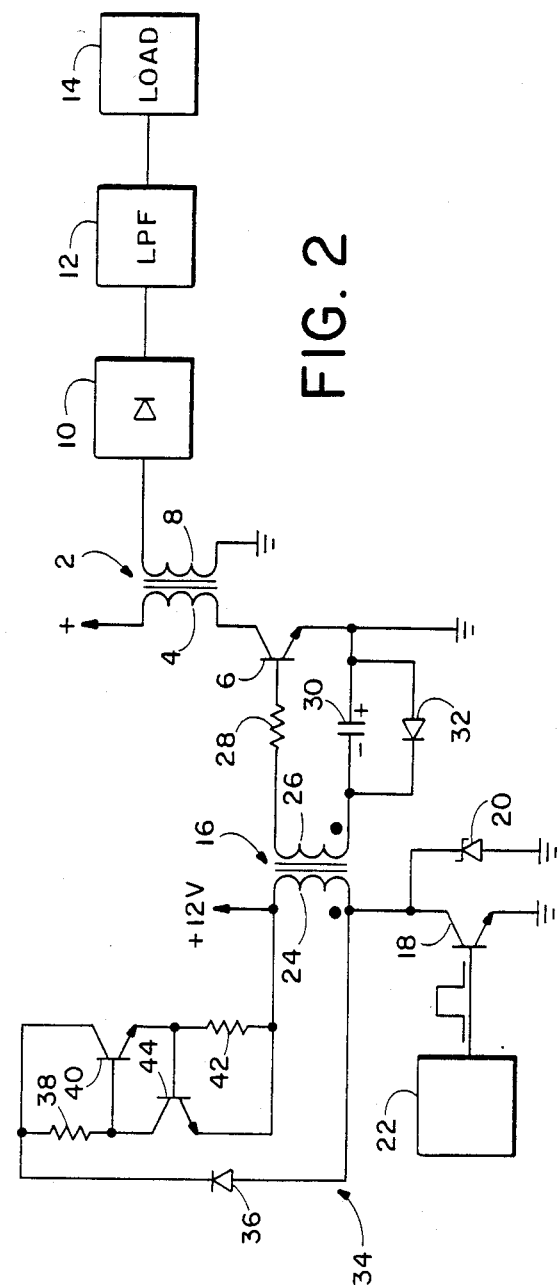
FIG. 2 illustrates schematically a switching power supply embodying the present invention.

The switching power supply illustrated in FIG. 2 differs from that of FIG. 1 in the connection of a current-dependent voltage clamp 34 across the primary winding 24 of the transformer 16. When the transistor 18 is on, the diode 36 is reverse-biased and therefore the clamp does not affect operation of the base drive circuit. However, when the transistor 18 is turned off, and the voltage at the collector of the transistor 18 rises, the diode 36 is forward-biased and is able to conduct current.

The clamp 34 prevents the voltage across the primary winding of the transformer 16 from exceeding a predetermined value when the current flowing through the clamp is itself less than a predetermined maximum value. Therefore, when the current through the clamp is small, the voltage across the primary winding is held to a low value. By thus limiting the voltage across the primary winding, the magnetizing current cannot decrease to zero before the transistor 18 is turned on again, and therefore the flux in the transformer core cannot reduce to zero.

Since the magnetizing current in the primary winding is not permitted to reduce to zero, the flux in the transformer core will build up on successive cycles and the magnetizing current from a given cycle will augment the magnetizing current from preceding cycles until the desired maximum value is attained. At this point, the voltage across the clamp rises and the core's flux is permitted to decrease. Thus, the magnetizing current does not increase without bounds.

Provided that the inductance of the primary winding of the transformer 16 is large, the reverse base current in the secondary winding 26 can increase only by a small amount beyond the value set by the current-dependent voltage clamp even if the duty cycle of the pulse generator 16 is large. Thus, the reverse base current can be kept nearly constant under all load and line conditions.

The current-dependent clamp 34 limits the voltage across the primary winding 24 of the transformer 16 in the following manner: when magnetizing current flows through the primary winding, the resistor 38 supplies base current to the transistor 40, causing the transistor 40 to conduct. The current conducted by the transistor 40 keeps the voltage across the primary winding small. If the current conducted by the transistor 40 becomes excessive, the voltage dropped across the resistor 42 causes the transistor 44 to conduct, turning the transistor 40 off and allowing the voltage across the primary winding 24 to rise.

It will be appreciated that the invention is not restricted to the particular power supply that has been shown and described with reference to FIG. 2 of the drawings, and that variations may be made therein without departing from the scope of the invention as defined in the appended claims, and equivalents thereof. For example, the disclosed implementation of the clamp circuit 34, comprising the diode 36, the resistors 38 and 42 and the transistors 40 and 44, is but one possible manner of implementing the desired function of limiting the voltage across the primary winding of the transformer 16 without allowing the magnetizing current to increase without bounds. Moreover, since the voltages across, and the currents through, the windings of the transformer are in proportion to one another, a current-dependent voltage clamp may be designed for connection across the secondary winding or a special third winding instead of the primary winding.

I claim:

1. An improved switching power supply of the type having a base drive transformer with a primary winding, a secondary winding and a core of magnetic material, a switch device connected to one end of the primary winding, and a transistor having its base connected to one end of the secondary winding and its emitter connected to the other end of the secondary winding so that, when the primary winding and the switch device are connected between a source of DC voltage and the switch device is closed intermittently, collector current is developed in the transistor, the improvement comprising a current-dependent voltage clamp connected across a winding of the transformer for preventing the voltage across the transformer winding from exceeding a predetermined limit so long as the magnetizing current, flowing in the primary winding when the switch device is opened, does not exceed a predetermined value.

2. A switching power supply comprising a base drive transformer having a primary winding, a secondary winding and a core of magnetic material, a switch device connected to one end of the primary winding, and a transistor having its base connected to one end of the secondary winding and its emitter connected to the other end of the secondary winding, so that when the primary winding and the switch device are connected between a source of DC voltage and the switch device is closed intermittently, collector current is developed in the transistor, and the power supply also comprising a current-dependent voltage clamp connected across a winding of the transformer for preventing the voltage across the transformer winding from exceeding a predetermined limit so long as the magnetizing current that flows in the primary winding when the switch device is opened does not exceed a predetermined value.

3. A power supply according to claim 1, wherein the current-dependent voltage clamp is connected in parallel with the primary winding of the transformer.

4. A power supply according to claim 1, wherein said current-dependent voltage clamp comprises a diode, and a two terminal network that comprises first and second transistors each having a base, a collector and an emitter, the collector of the first transistor being connected to one terminal of the network and the emitter of the second transistor being connected to the other terminal of the network, the base of the first transistor being connected to the collector of the second transistor and the emitter of the first transistor being connected to the base of the second transistor, and the network also comprises a first resistor connected between the base and collector of the first transistor and a second resistor connected between the base and emitter of the second transistor, and wherein one terminal of the network is connected through said diode to one end of one winding of the transformer and the other terminal of the network is connected to the other end of said one winding.

* * * * *